United States Patent [19]
Houser et al.

[11] Patent Number: 6,027,245
[45] Date of Patent: Feb. 22, 2000

[54] APPARATUS FOR MEASURING A TEMPERATURE OF A SUBSTRATE DURING A DRILLING OPERATION

[75] Inventors: David E. Houser; Francis S. Poch, both of Apalachin, N.Y.

[73] Assignee: International Business Machines Corporation, Armonk, N.Y.

[21] Appl. No.: 09/361,052

[22] Filed: Jul. 26, 1999

Related U.S. Application Data

[62] Division of application No. 09/017,741, Feb. 3, 1998.

[51] Int. Cl.⁷ ............................ G01K 11/00; G01N 25/20
[52] U.S. Cl. ............................ 374/162; 374/31; 374/43; 374/104; 116/216
[58] Field of Search .................................... 374/104, 106, 374/161, 162; 116/207, 216

[56] References Cited

U.S. PATENT DOCUMENTS

| | | |
|---|---|---|
| 3,087,238 | 4/1963 | Nottingham . |
| 3,373,611 | 3/1968 | Trott ........................ 374/155 |
| 3,817,103 | 6/1974 | Diamond et al. . |
| 4,161,557 | 7/1979 | Suzuki et al. ............................ 374/162 |
| 4,459,046 | 7/1984 | Spirg ........................................ 374/162 |
| 4,601,588 | 7/1986 | Takahara et al. ........................ 374/162 |
| 4,667,869 | 5/1987 | Gen et al. . |
| 4,891,250 | 1/1990 | Weibe et al. ............................ 374/162 |
| 4,945,919 | 8/1990 | Hattori . |
| 4,952,033 | 8/1990 | Davis ........................................ 374/162 |
| 5,067,859 | 11/1991 | Korbonski . |
| 5,082,402 | 1/1992 | Gaku et al. . |
| 5,246,291 | 9/1993 | Lebeau et al. . |
| 5,490,475 | 2/1996 | Bryant et al. ............................ 374/161 |
| 5,496,342 | 3/1996 | Urich . |
| 5,499,597 | 3/1996 | Kronberg ................................. 374/162 |
| 5,718,511 | 2/1998 | Mundt ...................................... 374/162 |

FOREIGN PATENT DOCUMENTS

| | | | |
|---|---|---|---|
| 0059129 | 4/1982 | Japan ...................................... 374/162 |
| 404186129 | 7/1992 | Japan ...................................... 374/117 |

OTHER PUBLICATIONS

Boll et al. "Two Dimensional Area Thermal Profiling," IBM Technical Disclosure Bulletin, vol. 37, No. 5, p. 287, 1994.
Kloepfer, J. Method of Measring The Circuit Board Temperature During Drilling, IBM Technical Disclosure Bulletin, vol. 26, No. 8, pp. 4108–4109, 1984.

*Primary Examiner*—Peter S. Wong
*Assistant Examiner*—Pia Tibbits
*Attorney, Agent, or Firm*—Schmeiser, Olsen & Watts; Ronald A. Kaschak

[57] ABSTRACT

The present invention provides a system for recording a heat exchange event within a drilled hole wall of a substrate during a drilling process. In particular, the invention includes a thermal sensitive film placed in contact with a substrate which is to be drilled, which is capable of recording a thermal signature of the heat transferred during the drilling process. The result is a ring shaped signature whose thickness provides a direct correlation to drilling temperature. With these results, the integrity of the substrate surrounding the drilled hole can be inspected.

15 Claims, 4 Drawing Sheets

APPARATUS FOR MEASURING A TEMPERATURE OF A SUBSTRATE DURING A DRILLING OPERATION This application is a divisional of Ser. No. 09/017,741, filed on Feb. 3, 1998.

BACKGROUND OF THE INVENTION

1. Technical Field

The present invention relates to drilling operations, and more specifically relates to a system and method for measuring thermal damage to a printed circuit board during a drilling operation.

2. Background Art

In the process of manufacturing printed circuit boards used in the electronics industry, many holes of various sizes have to be drilled through printed circuit boards to accommodate electrical interconnection of various layers of the printed circuit board and the electronic components mounted on it. Such interconnections are typically implemented with "plated through holes" (hereinafter, PTH's). As device sizes decrease and boards become more densely populated, it becomes much more challenging to drill holes with a high degree of integrity. Because hole sizes are relatively small, and multiple materials with differing properties are utilized within the circuit board, a great deal of care and precision is required during such drilling operations. Unfortunately, failures caused by thermal damage during drilling operations remain problematic because the damage is often difficult to detect and sometimes does not surface until a board failure occurs in the field. Thermal damage to epoxy resins, which hold the layers together, and copper lands, which provide electrical contact points within the circuit board, must therefore be guarded against during drilling operations of printed circuit boards.

The problem of ensuring drilled hole integrity is complicated by the fact that a typical drilling operation includes numerous variables, each of which directly affects the integrity of the drilled hole. For example, drill bit geometry, circuit board materials and feed and speed parameters all contribute to the amount of heat generated in the drilled hole. Thus, before any change can be made to one of these and many other variables, testing must be performed to ensure that the drilling process meets the performance requirements of the circuit board. In general, if too much heat is generated within the drilled hole, damage to the nearby portions of the circuit board could potentially lead to failure.

Present techniques for measuring hole quality with respect to plated-through holes (PTH's) require the time consuming step of carefully dissecting a drilled circuit board, and examining the damage around the drilled hole, typically with a microscope or the like. Such techniques are both costly and time consuming. Therefore, any time a change of process, materials or the like is required, the cost of manufacturing a printed circuit board is increased.

A related problem involves damage resulting from drill bit wear. As a drill bit deteriorates, the drilled hole precision and integrity likewise deteriorates. Unfortunately, it is difficult to determine just when it is time to change the drill bit in a drilling operation. Changing the drill bit too soon results in additional costs resulting from bit replacement, and changing the bit too late potentially results in a circuit board malfunction.

Unfortunately, until now, there has been no inexpensive, simple and accurate method of measuring drilled hole integrity in drilling operations involving printed circuit boards and other bulk materials. This method could help reduce the cost of manufacturing printed circuit boards.

SUMMARY OF THE INVENTION

The present invention provides a system and method for determining drilled hole integrity by recording heat generation within a drilled hole during a drilling operation. In particular, the invention provides a thermal sensitive material that is in contact with a substrate during drilling, wherein the thermal sensitive material is capable of recording a signature that measures the heat generated within the hole walls during a drilling operation. The thermal sensitive material is drilled along with the substrate. The thermal sensitive material may comprise thermal paper, acetate, and/or any other film-like material that is capable of recording thermal changes on a surface to which the film has made contact.

The method according to this invention comprises the steps of placing a thermal recording film on a surface that is to be penetrated with a drill bit, drilling a hole through both the film and the surface such that a thermal signature is recorded on the film proximate the hole, examining the size of the thermal signature and determining a relative or absolute amount of heat generated in the hole. The film may also be "sandwiched" between a plurality of layered substrates.

It is therefore an advantage of the present invention to provide a means for measuring drilling temperature, and to assess the hole quality with the use of a thermal sensitive material.

It is a further advantage of the present invention to provide a system and method for checking the integrity of holes drilled within a printed circuit board.

It is a further advantage of the present invention to provide a thermal sensitive film that contacts a substrate in order to analyze or monitor drilled hole integrity.

It is a further advantage of the present invention to provide a system and method for calculating drilling temperature based upon the size of a ring formed on a thermal sensitive film in contact with a substrate.

BRIEF DESCRIPTION OF THE DRAWINGS

These and other features and advantages of the present invention will become more apparent from the following detailed description of an exemplary embodiment therefore, as illustrated in the accompanying drawings, in which.

DETAILED DESCRIPTION OF THE PREFERRED EMBODIMENT

Figure 1:
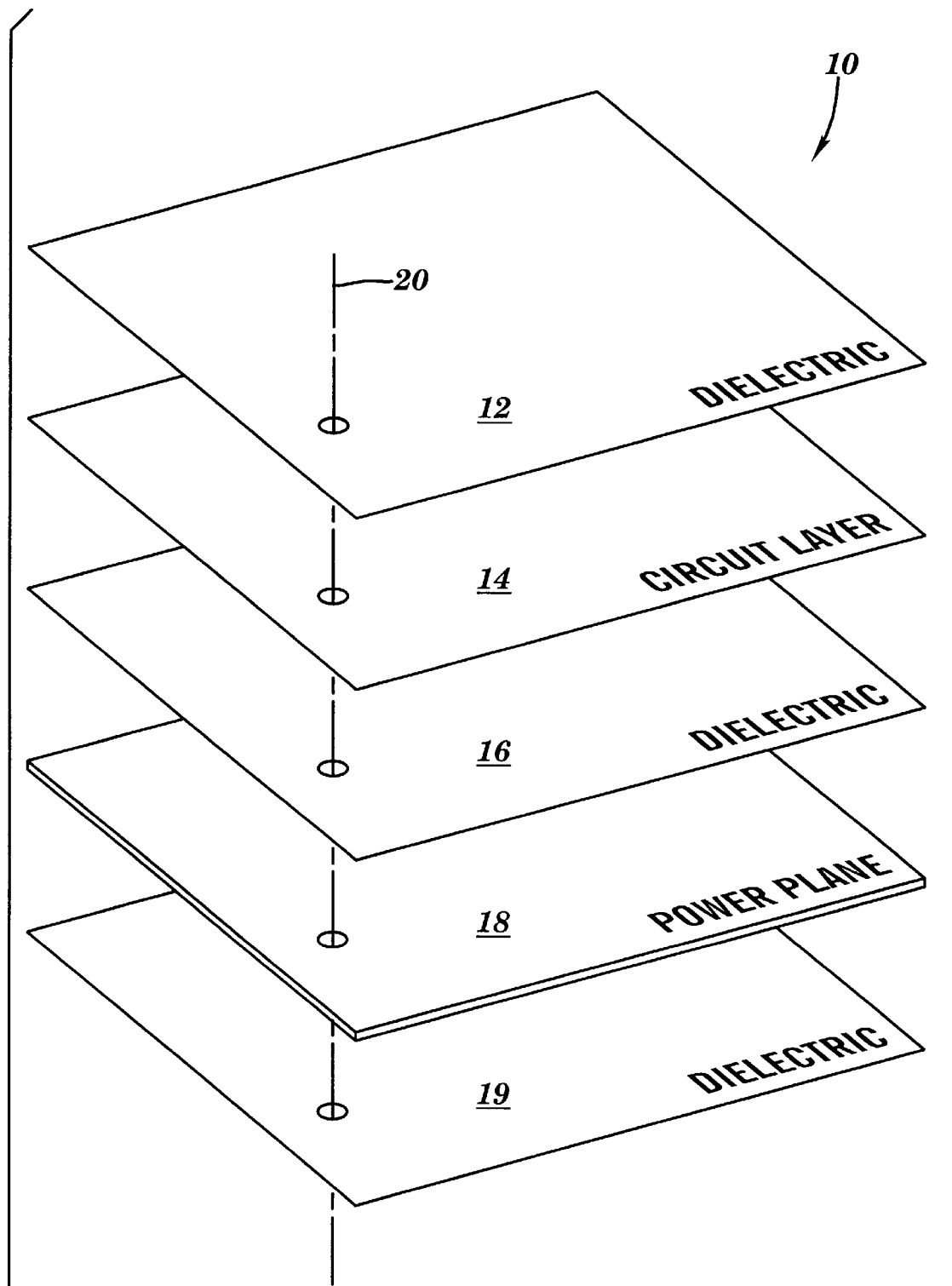
FIG. 1 depicts an exploded view of a printed circuit board.

FIG. 1 depicts an exploded view of a substrate such as a printed circuit board 10. The circuit board comprises a first dielectric layer 19, power plane 18, a second dielectric layer 16, a circuit layer 14, and a third dielectric layer 12. It is recognized that the actual number of layers within a typical circuit board may vary and the embodiment described in FIG. 1 is used primarily for the purpose of an example. Also shown in FIG. 1 is a vertical line 20 that defines a drilled hole that is typical of those required in the fabrication of printed circuit boards. In particular, drilled holes are required such that electrical signals can be delivered from various layers of the printed circuit board 10. Once the drilled hole is formed, vertical circuit paths or plated-through holes (PTH's) can be utilized to connect circuits on different layers to components mounted on the board. For instance, DC voltage from the power plane 18 may be delivered to components by one PTH and signal logic from circuit layer 14 may be delivered to components by another PTH. Holes in printed circuit boards are typically on the order of 0.25–1.0 millimeters in diameter and may be utilized for electrical, electrical/mechanical, or any other purpose required on the circuit board. In fabricating a printed circuit board, the layers are connected together typically with an epoxy resin or the like, and then the necessary holes are drilled through the circuit board and then the holes are plated with copper.

It should be recognized that while this preferred embodiment is directed at printed circuit boards, the invention can be applied or utilized in any operation where a substrate or bulk material is being drilled. It should likewise be recognized that the term "drilling operation" is to be interpreted broadly as any hole boring operation, including, but not limited to, laser drilling, punching, milling, etc.

Figure 2:
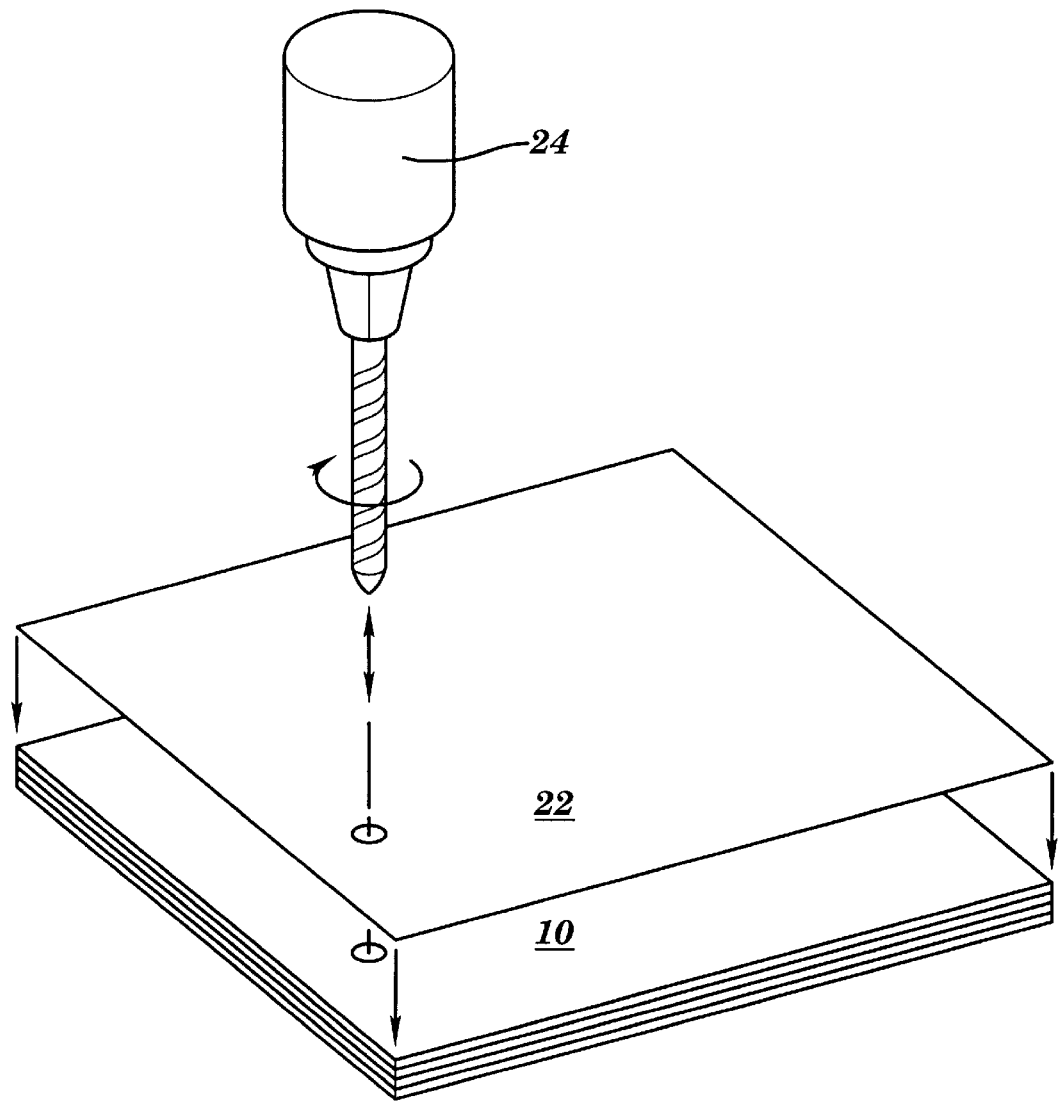
FIG. 2 depicts a printed circuit board in contact with a thermal sensitive film in accordance with a preferred embodiment of the present invention.

FIG. 2 depicts the printed circuit board 10 of FIG. 1 with a thermal sensitive film 22 placeable on the surface of the circuit board 10. Pursuant to this invention, thermal sensitive film 22 may be placed on either surface of the circuit board 10, or between any of the layers of a stack of circuit boards and process materials. Also shown in FIG. 2 is a drill 24 which operates along a vertical axis to bore holes through thermal sensitive film 22 and then through circuit board 10. When the film 22 is in contact with the circuit board 10, information regarding heat transfer caused during a drilling operation can be obtained. Thus, the heat transfer "event" caused by the work and friction of the drill bit drilling into the circuit board is captured on the film 22.

To capture the heat exchange event, the material used for thermal sensitive film 22 may be infrared sensitive so that it changes color when it is exposed to heat. Examples include thermal facsimile paper, overhead projection film and infrared photographic film. The material can also be made of polymers which soften when exposed to heat. Examples include thin transparent plastic sheets such as acetate, polyethylene, epoxy and polyamide. It should be recognized however, that any material or combination of materials capable of recording a heat transfer event could be utilized within the scope of this invention. As noted, the techniques described herein provide for the use of the film 22 to be positioned as an entry, backer or interleaf during the drilling operation of the circuit board. To obtain the best result, it has been found that using the film as an interleaf within a stack of parts or layers will provide the best thermal signature. However, it is recognized that other placements will still yield excellent results.

Figure 3:
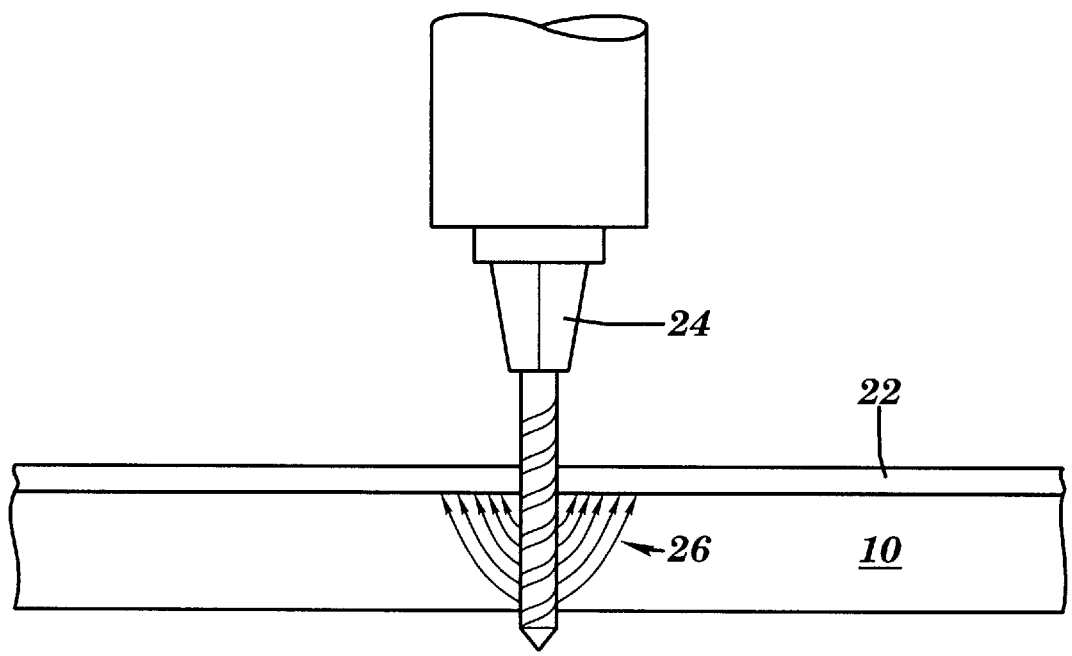
FIG. 3 depicts a cross-sectional view of a printed circuit board in contact with a thermal sensitive paper and a drill bit penetrating therethrough in accordance with a preferred embodiment of the present invention.

FIG. 3 depicts a cross-sectional view of a printed circuit board 10 with a thermal sensitive film 22 affixed on top thereof and a drill 24 penetrating therethrough. The thermal sensitive film 22, according to this invention, records a thermal signature of the drilling process. In this preferred embodiment, the thermal signature appears as a ring formed around the hole, after both the film 22 and circuit board 10 are drilled. The ring formed on any infrared materials is essentially a photographic image recording the heating event. A ring formed on a plastic type material is essentially a refractive distortion due to heating, softening and material flow. In the case of FIG. 3 where film 22 is a piece of thermal sensitive paper, it can be seen that the heating event is captured as heat flows along gradients 26 from the walls of the drilled hole through the circuit board and up to the surface, where the event is recorded on the paper.

Figure 4:
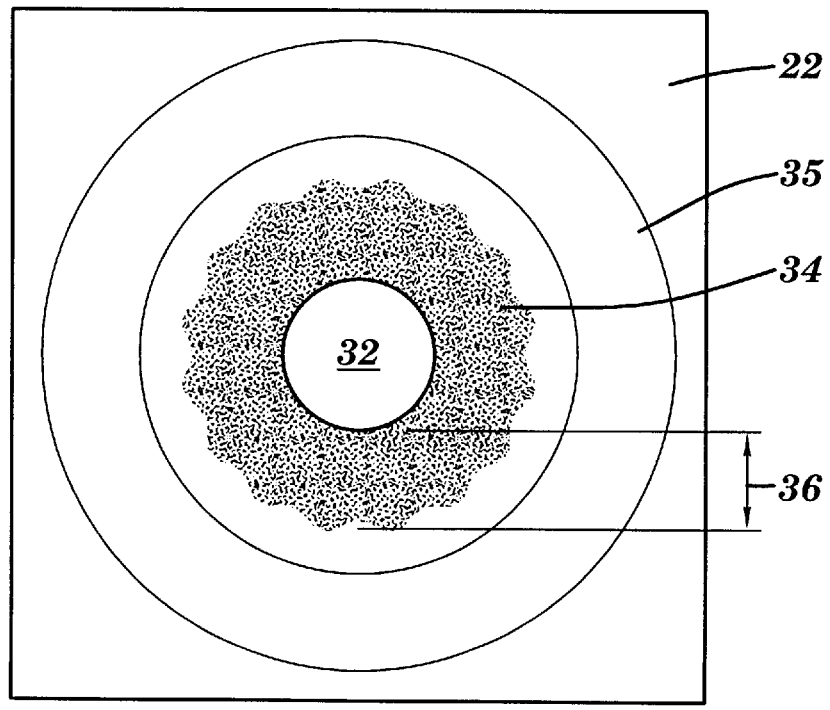
FIG. 4 depicts a thermal signature left on a piece of thermal sensitive film in accordance with a preferred embodiment of the present invention.

FIG. 4 depicts the sheet of film 22 with a thermal signature recorded thereon in the form of a ring 34 surrounding drilled hole 32. Because drilled hole quality can be directly correlated with drilling temperature, the thickness of the ring 36 can be utilized to provide a measurement of the drilling temperature, and therefore drilled hole quality. Moreover, the size of the ring could be calibrated to measure actual drilling temperatures with birefringence or hot contact probes techniques. Thus, measurement could be absolute, relative for comparison, quantitative or qualitative.

In general, for a given drilling time the temperature rise of the heating event caused by the drilling operation will be substantially proportional to the ring thickness 36. Thus, temperature may be represented mathematically as:

$$\Delta T = \alpha R,$$

where $\Delta T$ is the temperature rise, $R$ is the ring thickness, and $\alpha$ represents a proportionality constant of the specific system. In particular, $\alpha$ is dependent upon system variables such as board thermal conductivity and film thermal sensitivity etc. $\alpha$ could be calculated using calibration techniques, or by using a foreign device to measure drill hole temperature, so that actual temperatures can be calculated from the ring size. Alternatively, comparative temperature information can be collected by comparing the ring size of multiple drilling operations.

To further enhance the usefulness of this system and method, markings, such as concentric circles 3 5, can be included on the film 22 to provide indicators. In this manner, the signature can be easily inspected to determine if the event fell within the necessary quality parameters to ensure integrity of the circuit board.

Figure 5:
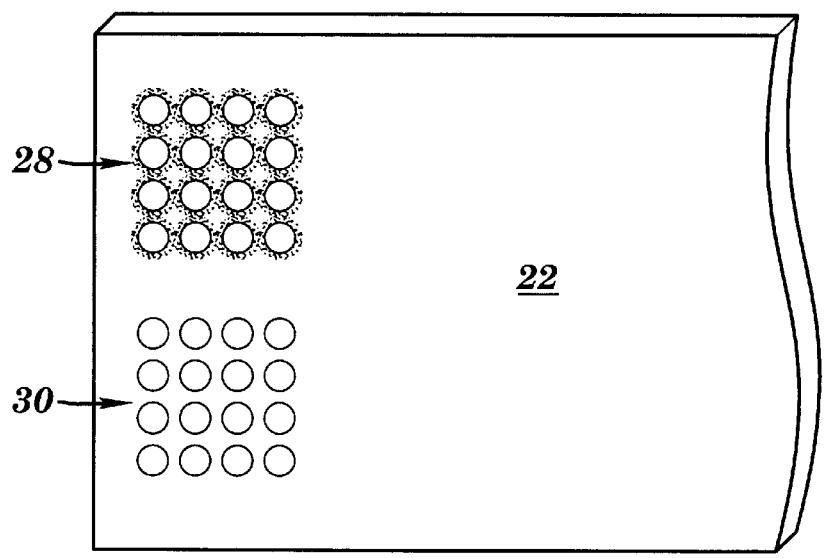
FIG. 5 depicts a top view of a printed circuit board showing the signature left on the thermal sensitive film after various drilling operations have occurred in accordance with a preferred embodiment of the present invention.

FIG. 5 depicts a first 28 and a second 30 series of holes and their respective thermal signatures as recorded on a sheet of thermal sensitive film 22. As can be seen, the first set of holes 28 left a larger signature as compared to these second set of holes 30. It therefore follows that the drilling temperature for the first set of holes 28 was greater than for the second set of holes 30. With this knowledge, quick and inexpensive decisions can be made regarding the efficacy of the drilling operation. Because this information is so readily obtainable, it is very easy for the drilling process to be altered without doing a detailed study of the circuit board, thereby saving both time and money.

Figure 6:
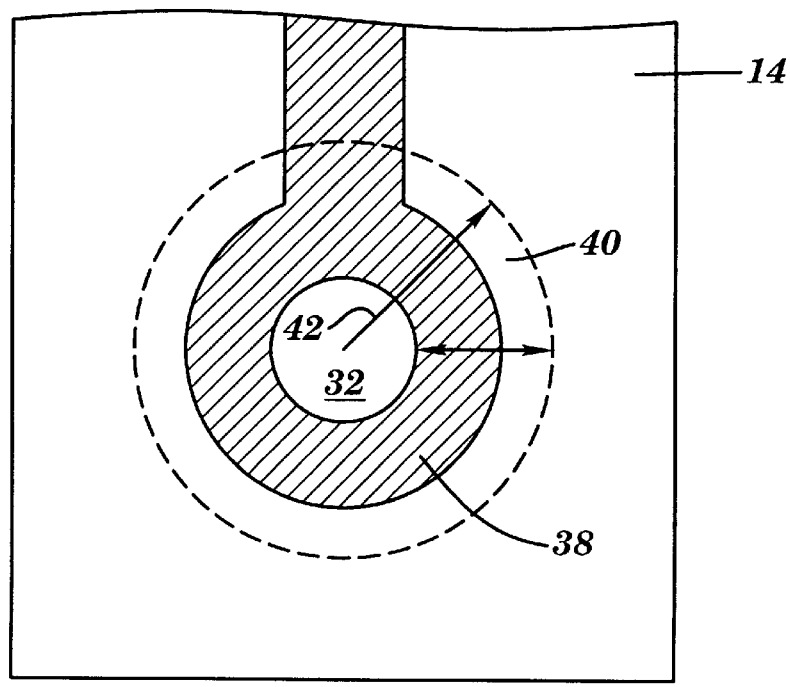
FIG. 6 depicts a circuit land having a hole bored therethrough.

Finally, FIG. 6 depicts a circuit land 38 which is essentially a circular conductive region through which a hole 32 can be drilled. Knowing the amount of the heat distributed radially outward from the hole in the printed circuit board, choices regarding materials, process parameters and the like can be made such that the integrity of this land 38 will be kept intact. As can be seen, during a drilling operation, a heat-affected zone 40 with a radius 42 is created that is larger than the land 38, and therefore can potentially cause the circuit land 38 to fail. By knowing that the heat-affected zone 40 extends outside the diameter of the land 38, which would be calculated directly from the thermal signature recorded on a thermal sensitive film 22, potential failures can be identified ahead of time. Thus in this case, it may be desirable to find a way to reduce the heat-affected zone, either by changing the substrate materials, drill bit geometry or process parameters involved.

While certain exemplary embodiments have been described and shown in the accompanying drawings, it is to be understood that such embodiments are merely illustrative of and not restrictive on the broad invention, and that this invention should not be limited to the specific constructions and arrangements shown and described, since various other modifications may occur to those ordinarily skilled in the art.

We claim:

1. An apparatus for measuring a temperature of a substrate during a boring operation, said apparatus comprising a film that is in contact with said substrate on a surface that is to be bored, wherein said film comprises a thermal sensitive material capable of recording radial temperature changes occurring around a bored hole.

2. The temperature measuring apparatus of claim 1 wherein said boring operation utilizes a drill.

3. The temperature measuring apparatus of claim 1 wherein said boring operation utilizes a laser.

4. The temperature measuring apparatus of claim 1 wherein said film comprises thermal paper.

5. The temperature measuring apparatus of claim 1 wherein said film comprises thin transparent plastic.

6. The temperature measuring apparatus of claim 1 wherein said substrate comprises a circuit board.

7. The temperature measuring apparatus of claim 6 wherein said circuit board includes a plurality of layered surfaces.

8. The temperature measuring apparatus of claim 1 wherein said radial temperature changes are recorded as a ring around the bored hole.

9. The temperature measuring apparatus of claim 8 wherein a thickness of said ring directly correlates to a maximum temperature in the bored hole at the time of boring.

10. The temperature measuring apparatus of claim 1 wherein said film is placeable between two surfaces.

11. A substrate having a thermal recording mechanism for recording temperature change proximate an inner wall of a drilled hole during a drilling operation, wherein the thermal recording mechanism comprises a film in contact with said substrate on a surface to be drilled, said film capable of recording radial temperature changes around the drilled hole.

12. The substrate of claim 11 wherein said film comprises thermal paper.

13. The substrate of claim 11 wherein said film comprises thin transparent plastic.

14. The substrate of claim 11 wherein said radial temperature changes are recorded on the film as a visible ring around the drilled hole.

15. The substrate of claim 11 wherein said substrate comprises a circuit board.

* * * * *